(12) United States Patent
Philip et al.

(10) Patent No.: US 11,800,819 B2
(45) Date of Patent: Oct. 24, 2023

(54) INTEGRATED DIODE MEMORY DEVICE

(71) Applicant: INTERNATIONAL BUSINESS MACHINES CORPORATION, Armonk, NY (US)

(72) Inventors: Timothy Mathew Philip, Albany, NY (US); Kevin W. Brew, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/247,123

(22) Filed: Dec. 1, 2020

(65) Prior Publication Data

US 2022/0173310 A1    Jun. 2, 2022

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/20* (2023.02); *H10N 70/8828* (2023.02); *H10N 70/8836* (2023.02)

(58) Field of Classification Search
CPC ...................................................... H01L 45/06
See application file for complete search history.

(56) References Cited

U.S. PATENT DOCUMENTS

| | | | |
|---|---|---|---|
| 7,804,703 B2 | 9/2010 | Ha | |
| 9,397,141 B2 | 7/2016 | Hashim | |
| 10,374,103 B1 | 8/2019 | Carta | |
| 2007/0133250 A1 | 6/2007 | Kim | |
| 2007/0218665 A1 | 9/2007 | Sutardja | |
| 2008/0272354 A1 | 11/2008 | Nirschl | |
| 2012/0068136 A1* | 3/2012 | Park | H01L 45/148 257/3 |
| 2012/0313069 A1 | 12/2012 | Wang | |

(Continued)

FOREIGN PATENT DOCUMENTS

| | | |
|---|---|---|
| CN | 110707209 A | 1/2020 |
| WO | 2022117279 A1 | 6/2022 |

OTHER PUBLICATIONS

Cyrille, et al., "OTS selector devices: Material engineering for switching performance," 2018 International Conference on IC Design & Technology (ICICDT), Jun. 4-6, 2018, pp. 113-116, IEEE, Otranto, Italy, DOI: 10.1109/ICICDT.2018.8399769, Retrieved from the Internet: URL: https://ieeexplore.ieee.org/document/8399769>.

(Continued)

*Primary Examiner* — Mounir S Amer
(74) *Attorney, Agent, or Firm* — L. Jeffrey Kelly

(57) ABSTRACT

A non-volatile memory structure may include a phase change memory comprising a phase change material. The non-volatile memory structure may include a Schottky diode in series with the phase change memory, wherein a Schottky barrier of the Schottky diode is a surface of the phase change memory. This may be accomplished through a proper selection of materials for the contact of the phase change memory. This may create an integrated diode-memory structure which may control directionality of current without a penalty on the footprint of the structure.

20 Claims, 3 Drawing Sheets

(56) References Cited

U.S. PATENT DOCUMENTS

| | | | | |
|---|---|---|---|---|
| 2020/0168792 A1* | 5/2020 | Song | .................. | G11C 13/0097 |
| 2021/0249597 A1* | 8/2021 | Wu | ...................... | H10N 70/231 |
| 2021/0376233 A1* | 12/2021 | Song | ................... | H10N 70/826 |

OTHER PUBLICATIONS

Gül, "Addressing the sneak-path problem in crossbar RRAM devices using memristor-based one Schottky diode-one resistor array," Results in Physics 12, pp. 1091-1096, vol. 12, Gumushane TK, DOI: 10.1016/j.rinp.2018.12.092 , Retrieved from the Internet: <URL: https://doi.org/10.1016/j.rinp.2018.12.092>.

Huang, et al., "Contact resistance measurement of Ge2Sb2Te5 phase change material to TiN electrode by spacer etched nanowire," Semiconductor Science and Technology, 2014, 9 pages, vol. 29, IOP Publishing, DOI: 10.1088/0268-1242/29/9/095003, Retrieved from the Internet: <URL: https://iopscience.iop.org/article/10.1088/0268-1242/29/9/095003>.

R. Huang, et al., "Towards a 3D GeSbTe Phase Change Memory with integrated selector by non-aqueous electrodeposition," Faraday Discussions, 2019, 16 pages, vol. 213, DOI: 10.1039/x0xx00000x, Retrieved from the Internet: <URL: https://eprints.soton.ac.uk/422858/1/GST_by_electrodeposition_Huang_de_Groot_after_revision_v2.pdf>.

Tallarida, et al., "Low temperature rectifying junctions for crossbar non-volatile memory devices," 2009 IEEE International Memory Workshop. May 10-14, 2009, 3 pages, IEEE, Monterey, CA, USA, ISBN: 978-1-4244-3762-7, DOI: 10.1109/IMW.2009.5090598, Retrieved from the Internet: <URL: https://ieeexplore.ieee.org/document/5090598>.

Notification of Transmittal of the International Search Report and the Written Opinion of the International Searching Authority, or the Declaration, dated Feb. 24, 2022, International application No. PCT/EP202/080809, 25 pages.

Tang et al., "Properties of p-n heterojunction diode based on Ge2Sb2Te5 and its application for phase change random access memory", Journal of Applied Physics 105, 061627 (2009), 4 pages.

* cited by examiner

INTEGRATED DIODE MEMORY DEVICE

BACKGROUND

The present invention relates to non-volatile memory, and more specifically, to a memristive device for neuromorphic computing.

"Machine learning" is used to broadly describe a primary function of electronic systems that learn from data. In accelerated machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANN architectures, neuromorphic microchips and ultra-high density non-volatile memory can be formed from high density, low cost circuit architectures known as cross-bar arrays. A basic crossbar array configuration includes a set of conductive row wires and a set of conductive column wires formed to intersect the set of conductive row wires. The intersections between the two sets of wires are separated by so-called crosspoint devices, which can be formed from thin film material. Cross-point devices can be implemented as so-called memristive devices. Characteristics of a memristive device include non-volatility, the ability to store a variable resistance value, and the ability to tune up or tune down a resistance using current or voltage pulses.

BRIEF SUMMARY

According to an embodiment of the present invention, a non-volatile memory structure may include a phase change memory including a phase change material. The non-volatile memory structure may include a Schottky diode in series with the phase change memory, where a Schottky barrier of the Schottky diode is a surface of the phase change memory. This may create an integrated diode-memory structure which may control directionality of current without a penalty on the footprint of the structure.

According to an embodiment of the present invention, a non-volatile memory structure may include a plurality of bit-lines and a plurality of word-lines. A PCM memory structure is located between the plurality of bit-lines and the plurality of word-lines. The PCM memory structure may include a phase change material located between a first contact and a second contact. The first contact and the second contact are different materials. This may create an integrated diode-memory structure which may control directionality of current without a penalty on the footprint of the structure.

According to an embodiment of the present invention, a non-volatile memory structure may include a plurality of bit-lines and a plurality of word-lines. A PCM memory structure is located between the plurality of bit-lines and the plurality of word-lines. The PCM memory structure may include a phase change material, and a Schottky diode in series with the phase change memory. A Schottky barrier of the Schottky diode is a surface of the phase change memory. The Schottky barrier is the interface between the phase change material and a contact. This may create an integrated diode-memory structure which may control directionality of current without a penalty on the footprint of the structure.

DETAILED DESCRIPTION

Figure 1:
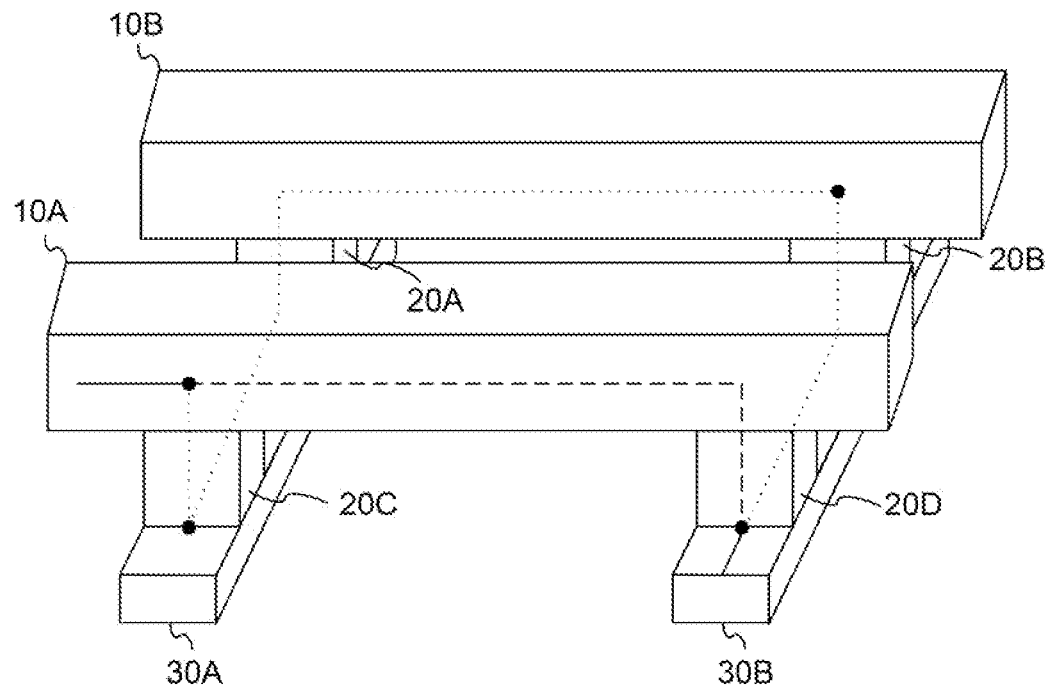
FIG. 1 depicts an arrangement of a cross-point array, according to an example embodiment.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 2:
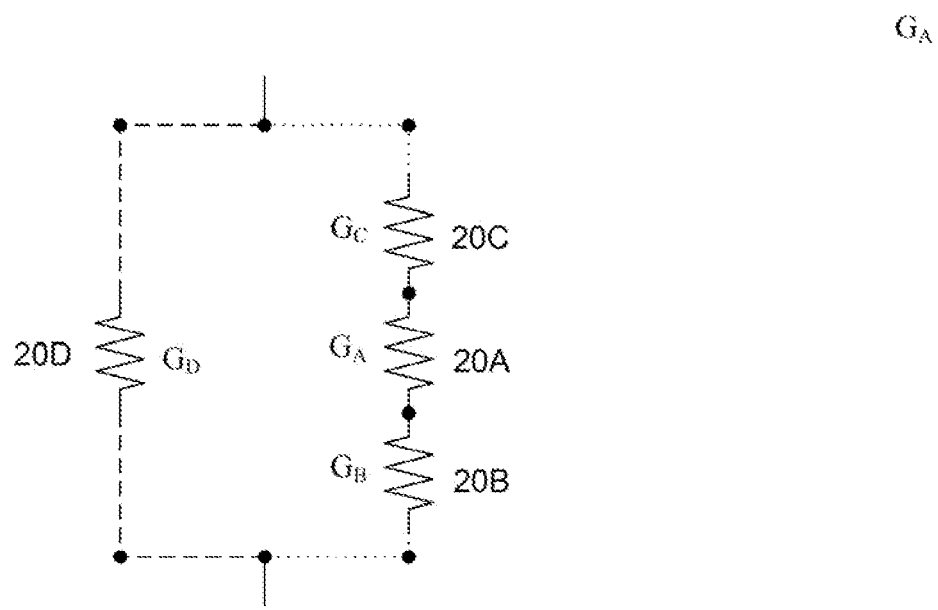
FIG. 2 depicts an electrical diagram for current flow paths through the cross-point array, according to an example embodiment.

Analog computing uses memory devices, such as memristors, that store information as a range of conductance of the memory device. Often times such memory devices are arranged in a cross-point array, having multiple wordlines and bitlines arranged in a grid-like pattern in which a single memory device may be read at a time as current is allowed to pass through a wordline and a bitline. For Example, FIG. 1 depicts a simplified cross-point array having a first wordline 10A, a second wordline 10B, a first memory device 20A, a second memory device 20B, a third memory device 20C, a fourth memory device 20D, a first bitline 30A, and a second bitline 30B. In the example depicted in FIG. 1, a desired read path P1 of fourth memory device 20D is depicted. However, during a read state of the fourth memory device 20D, a sneak path P2 may exist passing through the first memory device 20A, the second memory device 20B, and the third memory device 20C. The combination of read path P1 and sneak path P2 is depicted in FIG. 2, where there is a first conductance $G_A$ of the first memory device 20A, a second conductance $G_B$ of the second memory device 20B, a third conductance $G_C$ of the third memory device 20C, and a fourth conductance $G_D$ of fourth memory device 20D, Thus, in the example layout depicted in FIG. 1, instead of reading the state of the memory of fourth memory device 20D as a fourth conductance $G_D$, the state is instead a the fourth conductance $G_D$ combination a first conductance $G_A$ of the first memory device 20A, second conductance $G_B$ of the second memory device 20B, third conductance $G_C$ of the third memory device 20C, represented by the equation $$G_{Total} = G_D + \frac{G_A * G_B * G_C}{G_A * G_B + G_A * G_C + G_A * G_B}.$$

While this is a concern in traditional PCM memory applications, this concern is exacerbated when the depicted cross-point array is used in analog computing, wherein each memory device represents a range of values (i.e., analog) rather than a discrete value (i.e., digital), as a precise reading of the conductance of each memory device is necessary for proper downstream calculation.

Diodes may be used as a way to limit the direction of the current passing through a memory device, which may eliminate the sneak path P2 (e.g., removing the backward path through the first memory device 20A). But traditional diode designs create extra considerations for space and processing which make them expensive. The structures included in the current application present an integrated Schottky Diode and PCM structure. As understood in the current application, the phase change material of the PCM may act like a semiconductor, which may allow for a surface of the phase change material to act as a Schottky barrier when a suitable diode contact material is selected for a contact on only one of the surfaces of the phase change material. For example, for p-type structures the diode contact material may include materials having a lower work function than the barrier height of the phase change material, and in some embodiment may be selected to have a work function of 0.3-1 eV lower than the phase change material. In n-type structures, for example, the diode contact material may include materials having a higher work function than the barrier height of the phase change material, and in some embodiment may be selected to have a work function of 0.3-1 eV higher than the phase change material.

Figure 3:
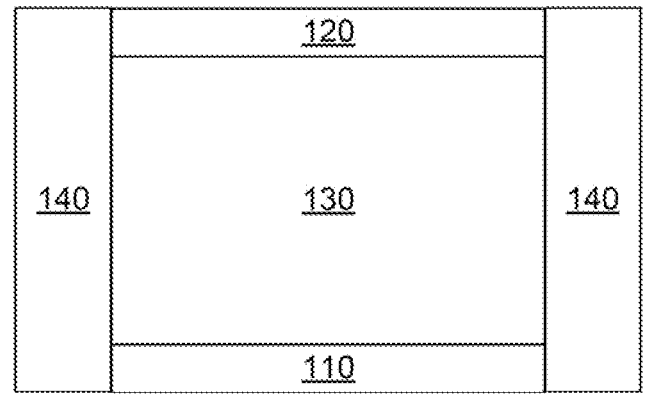
FIG. 3 depicts an electrical diagram for an integrated Schottky PCM cell, according to an example embodiment.

FIG. 3 depicts a cross-sectional view of an integrated diode phase change memory structure, according to an example embodiment. The material stack includes a bottom electrode 110, a top electrode 120, a phase change material 130, and an inter-layer dielectric (ILD) 140.

ILD 140 may be used to isolate the integrated diode memory cell. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

A phase change material 130 may be located above the bottom electrode 110, according to an example embodiment. The phase change material 130 may include a material that can be programmable to an amorphous (high resistance) state or a crystalline (low resistance) state with application of heat, such as a chalcogenide based material. Example chalcogenide based materials include, but are not limited to, $Ge_2Sb_2Te_5$ (GST), SbTe and $In_2Se_3$. The phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc.

The bottom electrode 110 and top electrode 120 are selected in a manner as to create a Schottky barrier with a surface of the phase change material 130. In order to do this, the bottom electrode 110 and top electrode 120 are selected so that one may include low resistance metals, while the other is formed of a contact diode material. The low resistance metals may Al, W, Cu, TiN, TaN, or other suitable materials. The contact diode material may be selected based on whether the PCM device is an n-type or p-type device. For a p-type device, the diode contact material may include materials having a lower work function than the barrier height of the phase change material, and in some embodiment may be selected to have a work function of 0.3-1 eV lower than the phase change material. For the above-referenced PCM materials, such diode contact materials may be, for example, Titanium, Molybdenum, Aluminum, Tantalum, Tungsten, Manganese, Zirconium, and Hafnium. For an n-type device, the diode contact material may include materials having a higher work function than the barrier height of the phase change material, and in some embodiment may be selected to have a work function of 0.3-1 eV higher than the phase change material. For the above-referenced PCM materials, such materials may be, for example, Molybdenum, Titanium Nitride, Tungsten, Gold, Cobalt, Copper, Nickel, Palladium, and Iridium.

As previously noted, the bottom electrode 110 and top electrode 120 are different contact materials to enable the Schottky barrier formed at the interface of the electrode made from the diode contact material and the phase change material 130 to act as a Schottky diode. Thus, in one example, the bottom electrode 110 is a low resistance metal and the top electrode 120 is a diode contact material. Thus, in another example, the top electrode 120 is a low resistance metal and the bottom electrode 110 is a diode contact material. It should be noted that while bottom electrode 110 and top electrode 120 may be separate layers and materials from word-lines and bit-lines attached to the electrodes, or may be indistinct from the word-lines and bit-lines that they're attached to (e.g., the word-line or bit-line may be the diode contact material and/or the low resistance metal).

Figure 4:
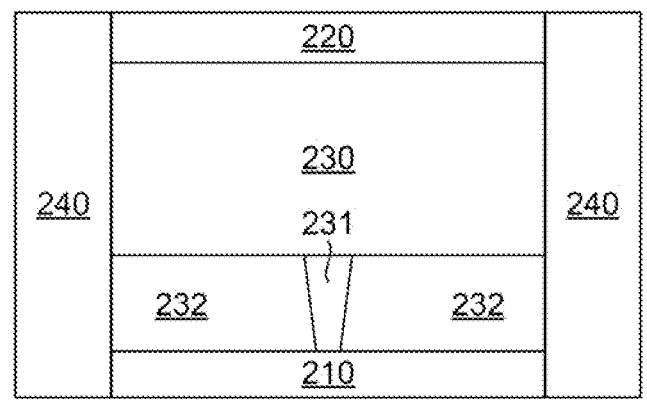
FIG. 4 depicts an electrical diagram for an integrated Schottky PCM mushroom cell, according to an example embodiment.

FIG. 4 depicts a cross-sectional view of an integrated diode mushroom cell phase change memory structure, according to an example embodiment. The material stack includes a bottom electrode 210, a top electrode 220, a phase change material 230, a PCM heater 231, a PCM dielectric 232, and an inter-layer dielectric (ILD) 240.

ILD 240 may be used to isolate the integrated diode memory cell. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH).

PCM dielectric 232 may be selected to withstand the heating caused by PCM heater 231 to change the state of the phase change material 230. PCM dielectric may include, but are not limited to, oxide low-κ materials such as silicon oxide (SiOx).

A phase change material 230 may be located above the PCM heater 231, according to an example embodiment. The phase change material 230 may include a material that can be programmable to an amorphous (high resistance) state or a crystalline (low resistance) state with application of heat, such as a chalcogenide based material. Example chalcogenide based materials include, but are not limited, to Ge$_2$Sb$_2$Te$_5$ (GST), SbTe and In$_2$Se$_3$. The phase change material can include a Ge—Sb—Te (germanium-antimony-tellurium or "GST", such as Ge$_2$Sb$_2$Te$_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide (Al$_2$O$_3$), silicon oxide (SiO$_2$), (Tantalum oxide (Ta$_2$O$_5$), hafnium oxide (HfO$_2$), zirconium oxide (ZrO$_2$), cerium Oxide (CeO$_2$), silicon nitride (SiN), silicon oxynitride (SiON), etc.

The PCM heater 231 and top electrode 220 are selected in a manner as to create a Schottky barrier with a surface of the phase change material 230. In order to do this, the PCM heater 231 and top electrode 220 are selected so that one may include low resistance metals, while the other is formed of a contact diode material. The low resistance metals may Al, W, Cu, TiN, TaN, or other suitable materials. The contact diode material may be selected based on whether the PCM device is an n-type or p-type device. For a p-type device, the diode contact material may include materials having a lower work function than the barrier height of the phase change material, and in some embodiment may be selected to have a work function of 0.3-1 eV lower than the phase change material. For the above-referenced PCM materials, such diode contact materials may be, for example, Titanium, Molybdenum, Aluminum, Tantalum, Tungsten, Manganese, Zirconium, and Hafnium. For an n-type device, the diode contact material may include materials having a higher work function than the barrier height of the phase change material, and in some embodiment may be selected to have a work function of 0.3-1 eV higher than the phase change material. For the above-referenced PCM materials, such materials may be, for example, Molybdenum, Titanium Nitride, Tungsten, Gold, Cobalt, Copper, Nickel, Palladium, and Iridium.

As previously noted, the PCM heater 231 and top electrode 220 are different contact materials to enable the Schottky barrier formed at the interface of the electrode made from the diode contact material and the phase change material 230 to act as a Schottky diode. Thus, in one example, the PCM heater 231 is a low resistance metal and the top electrode 220 is a diode contact material. Thus, in another example, the top electrode 220 is a low resistance metal and the PCM heater 231 is a diode contact material.

Bottom electrode 210 may be selected as a low resistance metal such as, for example, Al, W, Cu, TiN, TaN, or other suitable materials. It should be noted that while bottom electrode 210 and top electrode 220 may be separate layers and materials from word-lines and bit-lines attached to the electrodes, or may be indistinct from the word-lines and bit-lines that they're attached to (e.g., the word-line or bit-line may be the diode contact material and/or the low resistance metal).

Figure 5:
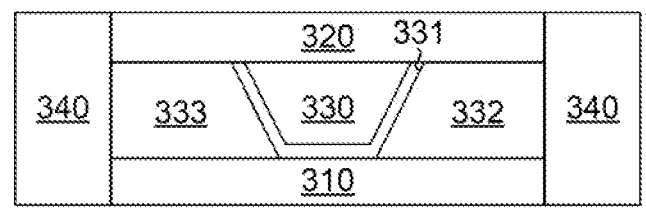
FIG. 5 depicts an electrical diagram for an integrated Schottky PCM confined cell, according to an example embodiment.

FIG. 5 depicts a cross-sectional view of an integrated diode mushroom cell phase change memory structure, according to an example embodiment. The material stack includes a bottom electrode 310, a top electrode 320, a phase change material 330, a liner 331, a PCM dielectric 332, and an inter-layer dielectric (ILD) 340.

ILD 340 may be used to isolate the integrated diode memory cell. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 3.7. By comparison, silicon dioxide (SiO$_2$) has a dielectric constant κ value of 3.9. Suitable ultralow-κ dielectric materials include, but are not limited to, porous organosilicate glass (pSiCOH).

PCM dielectric 332 may be selected to withstand the heating caused by PCM heater (liner) 331 to change the state of the phase change material 330. PCM dielectric may include, but are not limited to, oxide low-κ materials such as silicon oxide (SiOx).

A phase change material 330 may be located above the PCM heater (liner) 331, according to an example embodiment. The phase change material 330 may include a material that can be programmable to an amorphous (high resistance) state or a crystalline (low resistance) state with application of heat, such as a chalcogenide based material. Example chalcogenide based materials include, but are not limited, to Ge$_2$Sb$_2$Te$_5$ (GST), SbTe and In$_2$Se$_3$. The phase change material can include a Ge—Sb—Te (germanium-antimony-tellurium or "GST", such as Ge$_2$Sb$_2$Te$_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc.

The top electrode 320, and the liner 331 or the bottom electrode 310 are selected in a manner as to create a Schottky barrier with a surface of the phase change material 330. In order to do this, the top electrode 320, and the liner 331 or the bottom electrode 310 are selected so that one may include low resistance metals, while the other is formed of a contact diode material. The low resistance metals may Al, W, Cu, TiN, TaN, or other suitable materials. The contact diode material may be selected based on whether the PCM device is an n-type or p-type device. For a p-type device, the diode contact material may include materials having a lower work function than the barrier height of the phase change material, and in some embodiment may be selected to have a work function of 0.3-1 eV lower than the phase change material. For the above-referenced PCM materials, such diode contact materials may be, for example, Titanium, Molybdenum, Aluminum, Tantalum, Tungsten, Manganese, Zirconium, and Hafnium. For an n-type device, the diode contact material may include materials having a higher work function than the barrier height of the phase change material, and in some embodiment may be selected to have a work function of 0.3-1 eV higher than the phase change material. For the above-referenced PCM materials, such materials may be, for example, Molybdenum, Titanium Nitride, Tungsten, Gold, Cobalt, Copper, Nickel, Palladium, and Iridium.

As previously noted, the top electrode 320, and the liner 331 or the bottom electrode 310 are different contact materials to enable the Schottky barrier formed at the interface of the electrode made from the diode contact material and the phase change material 330 to act as a Schottky diode. Thus, in one example, the liner 331 is a low resistance metal and the top electrode 320 is a diode contact material. Thus, in another example, the top electrode 320 is a low resistance metal and the Liner 331 is a diode contact material.

Bottom electrode 310 may be selected as a low resistance metal such as, for example, Al, W, Cu, TiN, TaN, or other suitable materials. It should be noted that while bottom electrode 310 and top electrode 320 may be separate layers and materials from word-lines and bit-lines attached to the electrodes, or may be indistinct from the word-lines and bit-lines that they're attached to (e.g., the word-line or bit-line may be the diode contact material and/or the low resistance metal).

Figure 6:
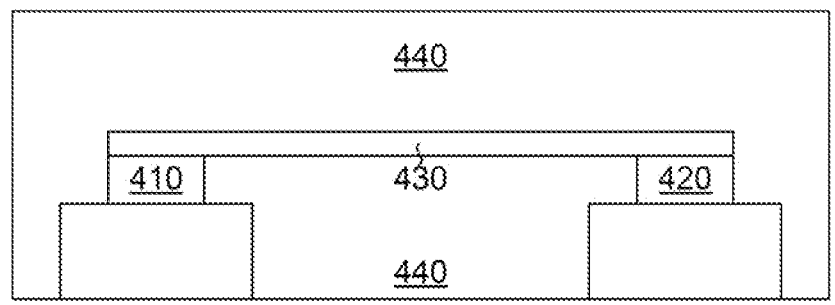
FIG. 6 depicts an electrical diagram for an integrated Schottky PCM bridge cell, according to an example embodiment; and Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

FIG. 6 depicts a cross-sectional view of an integrated diode phase change memory structure, according to an example embodiment. The material stack includes a first electrode 410, a second electrode 420, a phase change material 430, and an inter-layer dielectric (ILD) 440.

ILD 440 may be used to isolate the integrated diode memory cell. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

A phase change material 430 may be located above the first electrode 410, according to an example embodiment. The phase change material 430 may include a material that can be programmable to an amorphous (high resistance) state or a crystalline (low resistance) state with application of heat, such as a chalcogenide based material. Example chalcogenide based materials include, but are not limited to, $Ge_2Sb_2Te_5$ (GST), SbTe and $In_2Se_3$. The phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc.

The first electrode 410 and second electrode 420 are selected in a manner as to create a Schottky barrier with a surface of the phase change material 430. In order to do this, the first electrode 410 and second electrode 420 are selected so that one may include low resistance metals, while the other is formed of a contact diode material. The low resistance metals may Al, W, Cu, TiN, TaN, or other suitable materials. The contact diode material may be selected based on whether the PCM device is an n-type or p-type device. For a p-type device, the diode contact material may include materials having a lower work function than the barrier height of the phase change material, and in some embodiment may be selected to have a work function of 0.3-1 eV lower than the phase change material. For the above-referenced PCM materials, such diode contact materials may be, for example, Titanium, Molybdenum, Aluminum, Tantalum, Tungsten, Manganese, Zirconium, and Hafnium. For an n-type device, the diode contact material may include materials having a higher work function than the barrier height of the phase change material, and in some embodiment may be selected to have a work function of 0.3-1 eV higher than the phase change material. For the above-referenced PCM materials, such materials may be, for example, Mo, TiN, W, Au, Co, Cu, Ni, Pd, Ir, or other suitable materials.

As previously noted, the first electrode 410 and second electrode 420 are different contact materials to enable the Schottky barrier formed at the interface of the electrode made from the diode contact material and the phase change material 430 to act as a Schottky diode. Thus, in one example, the first electrode 410 is a low resistance metal and the second electrode 420 is a diode contact material. Thus, in another example, the second electrode 420 is a low resistance metal and the first electrode 410 is a diode contact material. It should be noted that while first electrode 410 and second electrode 420 may be separate layers and materials from word-lines and bit-lines attached to the electrodes, or may be indistinct from the word-lines and bit-lines that they're attached to (e.g., the word-line or bit-line may be the diode contact material and/or the low resistance metal).

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention is not limited to the exact forms and details described and illustrated but fall within the scope of the appended claims.

What is claimed is:

1. A non-volatile memory structure comprising:
   a phase change memory comprising a phase change material;
   a first electrode in direct contact with a first surface of the phase change material;
   a PCM heater in direct contact with a second surface of the phase change material, wherein the second surface of the phase change material is opposite the first surface of the phase change material; and
   wherein a work function of a material of the PCM heater is less than a work function of the phase change material.

2. The structure of claim 1, wherein a width of the phase change material is equal to a width of the first electrode.

3. The structure of claim 1, wherein a material of the first electrode is selected from the group consisting of: aluminum, tungsten, copper, titanium nitride, and tantalum nitride, and wherein the material of the PCM heater is selected from the group consisting of: molybdenum, tantalum, tungsten, manganese, zirconium, and hafnium.

4. The structure of claim 1, wherein a material of the first electrode is selected from the group consisting of: aluminum, tungsten, copper, titanium nitride, and tantalum nitride, and wherein the material of the PCM heater is selected from the group consisting of: molybdenum, tungsten, gold, cobalt, copper, nickel, palladium, and iridium.

5. The structure of claim 1, wherein a material of the first electrode is selected from the group consisting of: aluminum, tungsten, copper, and wherein the material of the PCM heater is selected from the group consisting of: zirconium and hafnium.

6. The structure of claim 1, wherein a material of the first electrode is selected from the group consisting of: aluminum, tungsten, copper, and wherein the material of the PCM heater is selected from the group consisting of: nickel, palladium, and iridium.

7. The structure of claim 1, further comprising:
   a second electrode directly contacting the PCM heater, wherein the first electrode and the second electrode are made from a first material and the PCM heater is made from a second material, wherein the first material is different from the second material.

8. A non-volatile memory structure comprising:
   a phase change memory comprising a phase change material;
   a top electrode in direct contact with a top surface of the phase change material;
   a liner in direct contact with sidewalls and a bottommost surface of the phase change material;
   a bottom electrode in direct contact with a bottommost surface of the liner;
   wherein a work function of a material of the liner is less than a work function of the phase change material.

9. The structure of claim 8, wherein a width of the phase change material is less than a width of the top electrode and less than a width of the bottom electrode.

10. The structure of claim 8, wherein a material of the top electrode is selected from the group consisting of: aluminum, tungsten, copper, titanium nitride, and tantalum nitride, and wherein the material of the liner is selected from the group consisting of: molybdenum, tantalum, tungsten, manganese, zirconium, and hafnium.

11. The structure of claim 8, wherein a material of the top electrode is selected from the group consisting of: aluminum, tungsten, copper, titanium nitride, and tantalum nitride, and wherein the material of the liner is selected from the group consisting of: molybdenum, tungsten, gold, cobalt, copper, nickel, palladium, and iridium.

12. The structure of claim 8, wherein a material of the top electrode is selected from the group consisting of: aluminum, tungsten, copper, and wherein the material of the liner is selected from the group consisting of: zirconium and hafnium.

13. The structure of claim 8, wherein a material of the top electrode is selected from the group consisting of: aluminum, tungsten, copper, and wherein the material of the liner is selected from the group consisting of: nickel, palladium, and iridium.

14. The structure of claim 8, wherein a width of the top electrode is equal to a width of the bottom electrode.

15. A non-volatile memory structure comprising:
   a phase change material located between a first metal contact and a second metal contact, wherein a top surface of the first metal contact directly contacts a bottom surface of the phase change material and the bottom surface of the phase change material directly contacts a top surface of the second metal contact,
   wherein a work function of a material of the first metal contact is less than a work function of the phase change material.

16. The structure of claim 15, wherein the first metal contact and the second metal contact are different materials.

17. The structure of claim 15, wherein the material of the first metal contact is selected from the group consisting of: aluminum, tungsten, copper, titanium nitride, and tantalum nitride, and wherein the material of the second metal contact is selected from the group consisting of: molybdenum, tantalum, tungsten, manganese, zirconium, and hafnium.

18. The structure of claim 15, wherein the material of the first metal contact is selected from the group consisting of: aluminum, tungsten, copper, titanium nitride, and tantalum nitride, and wherein the material of the second metal contact is selected from the group consisting of: molybdenum, tungsten, gold, cobalt, copper, nickel, palladium, and iridium.

19. The structure of claim 15, wherein the material of the first metal contact is selected from the group consisting of: aluminum, tungsten, copper, and wherein the material of the second metal contact is selected from the group consisting of: zirconium and hafnium.

20. The structure of claim 15, wherein the material of the first metal contact is selected from the group consisting of: aluminum, tungsten, copper, and wherein the material of the second metal contact is selected from the group consisting of: nickel, palladium, and iridium.

* * * * *